United States Patent
Alhawari et al.

(10) Patent No.: US 11,664,787 B2
(45) Date of Patent: May 30, 2023

(54) CMOS LADDERED INVERTER RING OSCILLATOR

(71) Applicant: Wayne State University, Detroit, MI (US)

(72) Inventors: Mohammad Alhawari, Dearborn, MI (US); Melvin D. Edwards, II, Redford, MI (US)

(73) Assignee: Wayne State University, Detroit, MI (US)

( * ) Notice: Subject to any disclaimer, the term of this patent is extended or adjusted under 35 U.S.C. 154(b) by 0 days.

(21) Appl. No.: 17/686,825

(22) Filed: Mar. 4, 2022

(65) Prior Publication Data

US 2022/0286116 A1 Sep. 8, 2022

Related U.S. Application Data

(60) Provisional application No. 63/156,610, filed on Mar. 4, 2021.

(51) Int. Cl.
  *H03K 3/03* (2006.01)
  *H03K 3/021* (2006.01)
  *H03K 19/20* (2006.01)

(52) U.S. Cl.
  CPC .......... *H03K 3/0315* (2013.01); *H03K 3/021* (2013.01); *H03K 19/20* (2013.01)

(58) Field of Classification Search
  CPC ....... H03K 3/021; H03K 3/0315; H03K 19/20
  USPC ...................... 331/57; 327/156, 159; 326/16
  See application file for complete search history.

(56) References Cited

U.S. PATENT DOCUMENTS

| | | | | |
|---|---|---|---|---|
| 2006/0170476 A1* | 8/2006 | Carley | ................. | H03H 11/265 327/261 |
| 2006/0170482 A1* | 8/2006 | Carley | .................. | H03K 5/133 327/396 |

OTHER PUBLICATIONS

Nausieda, I. et al. "Dual threshold voltage integrated organic technology for ultralow-power circuits." 2009 IEEE International Electron Devices Meeting (IEDM), 2009 IEEE International, Piscataway, NJ, USA, Dec. 7, 2009, pp. 1-4.
V. R. Nandyala and K. K. Mahapatra, "A circuit technique for leakage power reduction in CMOS VLSI circuits," 2016 International Conference on VLSI Systems, Architectures, Technology and Applications (VLSI-SATA), IEEE, Jan. 10, 2016, pp. 1-5.
M. Alhawari, N. Albelooshi and M. H. Perrott, "A 0.5V <4 μW CMOS photoplethysmographic heart-rate sensor IC based on a non-uniform quantizer," 2013 IEEE International Solid-State Circuits Conference Digest of Technical Papers (ISSCC), 2013 IEEE International, IEEE, Feb. 17, 2013, pp. 384-385.

(Continued)

*Primary Examiner* — Arnold M Kinkead
(74) *Attorney, Agent, or Firm* — Fishman Stewart PLLC

(57) ABSTRACT

A ring oscillator includes a first set of at least three laddered inverter quantizer (LIQAF) circuits connected in stages that are in series, including a first LIQAF circuit and a last LIQAF circuit, and a feedback circuit from the last LIQAF circuit to the first LIQAF circuit having a logical NOT output compared to the first LIQAF circuit. A voltage input creates a pair of phase shifted waveforms in the first of the at least three LIQAF circuits that propagate sequentially through the stages of the at least three LIQAF circuits. Each stage has a pair of outputs to the next stage that are then phase shifted from the previous stage in the next stage.

20 Claims, 9 Drawing Sheets

(56) References Cited

OTHER PUBLICATIONS

M. Alhawari and M. H. Perrott, "A clockless, multi-stable, CMOS analog circuit," 2014 IEEE International Symposium an Circuits and Systems (ISCAS), IEEE, Jun. 1, 2014, pp. 1764-1767.

Int'l Search Report dated Jul. 1, 2022 for copending Int'l App. No. PCT/US2022/018936.

K. Un et al., "Analysis and design of open-loop multiphase local-oscillator generator for wireless applications," IEEE Transactions on Circuits and Systems 1: Regular Papers, vol. 57, pp. 970-981, May 2010.

M.Z. Straayer et al., "A multi-path gated ring oscillator tdc with first-order noise shaping," IEEE Journal of Solid-State Circuits, vol. 44, pp. 1089-1098, Apr. 2009.

B. Ghafari et al., "An ultra-low power and low-noise voltage-controlled ring oscillator for biomedical applications," in IEEE 2013 Tencon—Spring, pp. 20-24, Apr. 2013.

K. Pappu et al., "5.4 frequency-locked-loop ring oscillator with 3ns peak-to-peak accumulated jitter in 1 ms time window for high-resolution frequency counting," in 2017 IEEE International Solid-State Circuits Conference (ISSCC), pp. 92-93, Feb. 2017.

M. Alhawari et al., "A 0.5 v < 4 µw cmos light-to-digital converter based on a nonuniform quantizer for a photoplethysmographic heart-rate sensor," IEEE Journal of Solid-State Circuits, vol. 49, pp. 271-288, Jan. 2014.

\* cited by examiner

CMOS LADDERED INVERTER RING OSCILLATOR

CROSS-REFERENCE TO RELATED APPLICATIONS

This application claims priority to U.S. Provisional Application Ser. No. 63/156,610 filed Mar. 4, 2021, the contents of which are hereby incorporated by reference in their entirety.

TECHNICAL FIELD

This disclosure relates generally to ring oscillator technology.

BACKGROUND

A ring oscillator is a device or circuit that includes an odd number of NOT gates or inverters in a ring whose output oscillates non-sinusoidally between output levels. A single inverter computes the logical NOT of its input, and thus the last output of a chain of an odd number of inverters is the logical NOT of the first input. The final output of the ring oscillator thereby becomes the input to the ring oscillator and, being the logical NOT to the first input, continues to drive the oscillation.

A ring oscillator typically only requires power to operate, and above a certain voltage, typically well below the threshold voltage of the MOSFETs used, oscillations begin spontaneously. To increase the frequency of oscillation, two methods are commonly used. First, making the ring from a smaller number of inverters results in a higher frequency of oscillation, with about the same power consumption. Second, the supply voltage may be increased. In circuits where this method can be applied, this reduces the propagation delay through the chain of stages.

In operation and in a device using MOSFETS, gate capacitance is charged before current can flow between the source and the drain, resulting in an oscillating output that changes after a period of time after the input is charged. Thus, there is a time delay between the output and the input, and since the amplifier in such a circuit has a negative gain, the output will change in a direction opposite that of the input—hence the NOT designation.

A time-delay of the typical ring oscillator may be effected by adding even numbers of inverters without affecting the "NOT" output. Rather than having a single time delay element, each inverter contributes to the delay of the signal around the ring, and adding pairs of inverters increases the delay, thereby decreasing the oscillator frequency. The delay may also be effected by changing the supply voltage.

The ring oscillator circuit has many uses in electronics and communications. Applications include edge internet-of-things (IoT) devices, start-up systems thermoelectric energy harvesting, time to digital circuits, time domain neural networks, voltage controlled ring oscillators for biomedical applications, and frequency locked loops, as examples. The ring oscillator may also be used in a battery saver circuit in a larger system aimed at extending battery life of portable devices. The speed of the inverter is typically in the 115 MHz-1.8 GHz range, but has the ability to give high time resolution owing to the laddered structure of the ring oscillator. In the CMOS inverter ring oscillator the number of phases is increased by increasing the number stages to another odd number.

Because the time delay in a typical ring oscillator is due, at least in part, to the gate capacitance and the time and energy to charge, the overall time delay of the oscillator can be increased by adding inverters in pairs—reducing the oscillation frequency. As indicated, adding in pairs maintains the same NOT status while impacting the frequency of operation. Typically, the oscillation period is equal to twice the sum of individual delays of all the stages. Use of inverters, however, can have its downside due to the increased power consumption by the use of many inverters.

As such, there is a need for an improved ring oscillator.

BRIEF SUMMARY

A ring oscillator includes a first set of at least three laddered inverter quantizer (LIQAF) circuits connected in stages that are in series, including a first LIQAF circuit and a last LIQAF circuit, and a feedback circuit from the last LIQAF circuit to the first LIQAF circuit having a logical NOT output compared to the first LIQAF circuit. A voltage input creates a pair of phase shifted waveforms in the first of the at least three LIQAF circuits that propagate sequentially through the stages of the at least three LIQAF circuits. Each stage has a pair of outputs to the next stage that are then phase shifted from the previous stage in the next stage.

A method of constructing a ring oscillator includes connecting a first set of at least three laddered inverter quantizer (LIQAF) circuits in stages that are in series, including a first LIQAF circuit and a last LIQAF circuit, and providing a feedback circuit from the last LIQAF circuit to the first LIQAF circuit having a logical NOT output compared to the first LIQAF circuit. A voltage input creates a pair of phase shifted waveforms in the first of the at least three LIQAF circuits that propagate sequentially through the stages of the at least three LIQAF circuits. Each stage has a pair of outputs to the next stage that are then phase shifted from the previous stage in the next stage.

A ring oscillator includes a structure having a two level CMOS laddered inverter quantizer (LIQAF) and three horizontal LIQAF blocks, the three horizontal LIQAF blocks in each of the two levels connected in stages that are in series, including a first LIQAF circuit and a last LIQAF circuit, and a feedback circuit from the last LIQAF circuit to the first LIQAF circuit having a logical NOT output compared to the first LIQAF circuit. A voltage input in the three horizontal LIQAF blocks in each of the two levels creates a pair of phase shifted waveforms in the first of the three horizontal LIQAF blocks that propagate sequentially through the stages of the three LIQAF blocks. Each stage of the three horizontal LIQAF blocks in each of the two levels has a pair of outputs to the next stage that are then phase shifted from the previous stage in the next stage.

BRIEF DESCRIPTION OF THE DRAWINGS

While the claims are not limited to a specific illustration, an appreciation of the various aspects is best gained through a discussion of various examples thereof. Although the drawings represent illustrations, the drawings are not necessarily to scale and certain features may be exaggerated to better illustrate and explain an innovative aspect of an example. Further, the exemplary illustrations described herein are not intended to be exhaustive or otherwise limiting or restricted to the precise form and configuration shown in the drawings and disclosed in the following detailed description. Exemplary illustrates are described in detail by referring to the drawings as follows:

DETAILED DESCRIPTION

According to the disclosure, a $V_{DD}$ controlled, ring oscillator provides several phase shifted outputs based on a laddered inverter quantizer (LIQAF) circuit. $V_{DD}$ is the input and the outputs are the intermediate LIQAF outputs. The disclosed circuit achieves the several phase shifted waveforms by the use of the LIQAF circuit as a chain of parallelized inverters. These inverters each have their own propagation delay, which all yield a phase shifted version of the same waveform. Exemplary pre and post layout show simulation results for 2, 4, and 8-level versions of the ring oscillator circuit in a 65 nm CMOS process are disclosed. Exemplary results demonstrate that the disclosed circuit can operate at low-power consumption from a wide range of supply voltages with robust operation across process and temperature variations. The disclosed circuit has the potential to be integrated into, for example, a Time to Digital Converter along with other implementations.

The Laddered-Inverter Quantizer/Amplifier/Filter (LIQAF) may be considered as an inverter topology. The inverter in this case is two CMOS inverter laddered, see FIG. 1A. $M_0$ and $M_1$ form an inverter 104 while $M_2$ and $M_3$ form another inverter 106. The operation of this circuit allows for two outputs that are unique in phase, generated from one input. As indicated in FIG. 1B, the circuit can be viewed as a combination of two CMOS inverters that have different ratios of n-channel metal oxide semiconductor (NMOS) versus p-channel metal oxide semiconductor (PMOS) gate lengths, which yields the exemplary shifted DC characteristics shown in FIG. 1C.

Figure 1A:
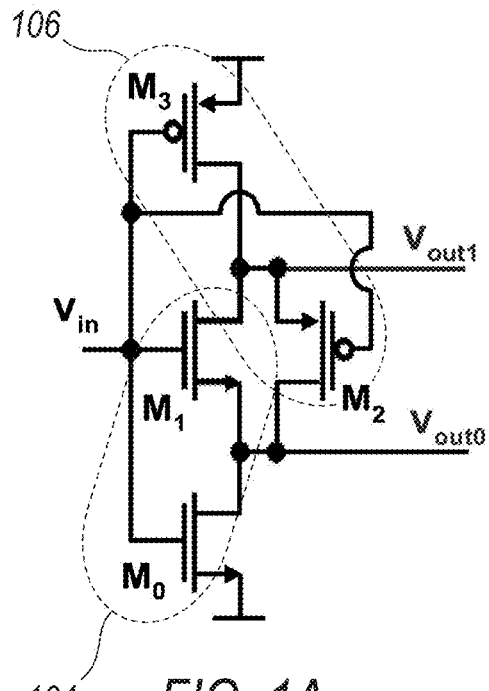
FIG. 1A illustrates an exemplary a LIQAF circuit.
Figure 1B:
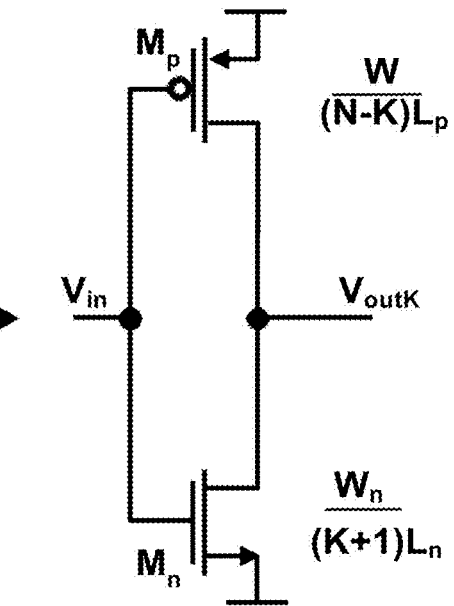
FIG. 1B illustrates the circuit of FIG. 1A as a combination of two CMOS inverters that have different ratios of NMOS versus PMOS gate lengths.
Figure 1C:
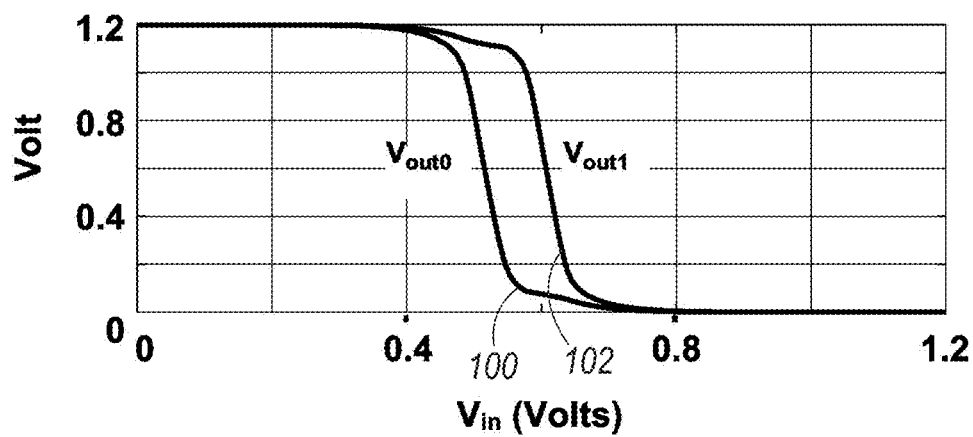
FIG. 1C is an illustration of exemplary and simulated shifted direct current (DC) characteristics yielded from the exemplary circuit of FIG. 1A.

Referring to FIGS. 1A and 1C, when $V_{in}$ is generally low and both outputs are high, transistor $M_1$ is inactive such that $V_{out0}$ transitions with increasing $V_{in}$ according to a CMOS inverter characteristic with one NMOS device, $M_0$, and two series PMOS devices, $M_2$ and $M_3$. In contrast, when $V_{in}$ is high and both outputs are low, $M_2$ is inactive such that $V_{out1}$ transitions with decreasing $V_{in}$ according to a CMOS inverter characteristic with two series NMOS, $M_0$ and $M_1$, devices and one PMOS device, $M_3$. Looking at $V_{out1}$, this inverter is pulled high by $M_3$ and pulled low by $M_0$ and $M_1$. Looking at $V_{out0}$, this inverter is pulled high by $M_2$ and $M_3$ and pulled low by $M_0$. This stacking generally causes the exemplary shifted DC characteristic 100, 102 shown in FIG. 1C. It follows that $V_{out1}$ is high for $V_{out0}$ to go high and $V_{out0}$ is low for $V_{out1}$ to go low. This fundamental characteristic is taken advantage of in the PWM generation shown in the exemplary measurement results.

Disclosed Ring Oscillator Circuit

Figure 2A:
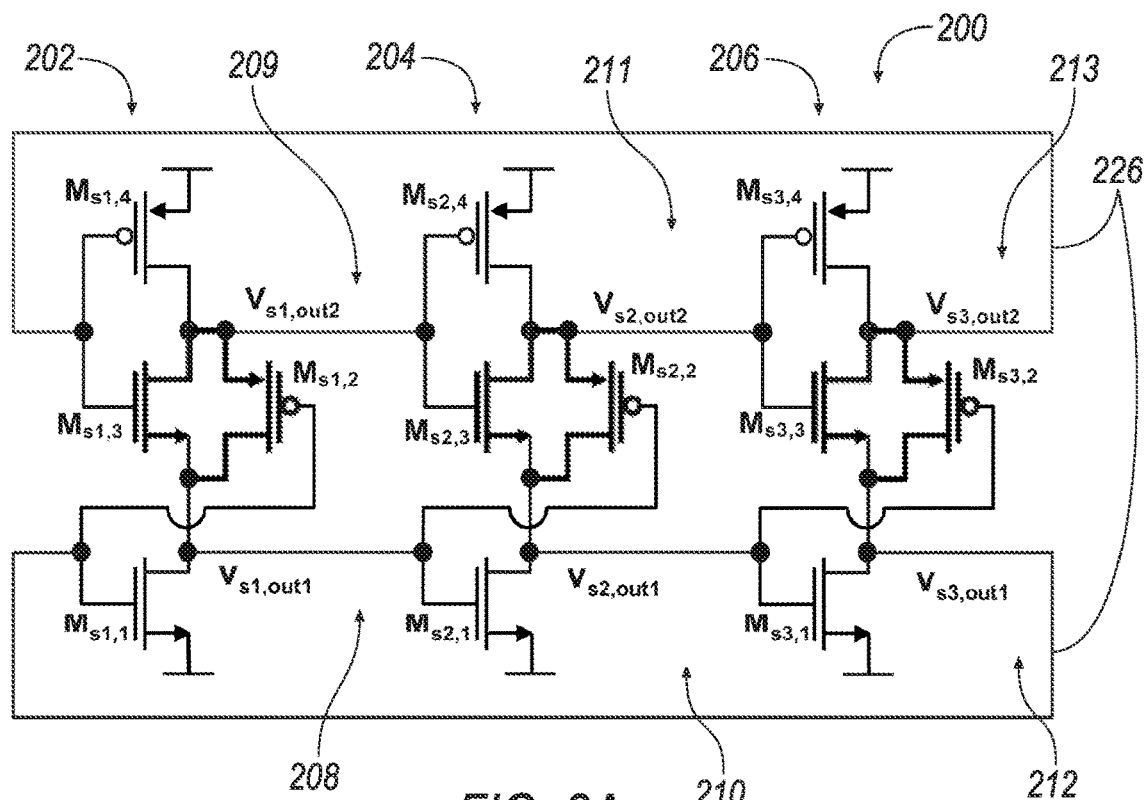
FIG. 2A is an illustration of an exemplary LIQAF structure expanded out for three stages to form a ring oscillator (exemplary six output phase ring oscillator)
Figure 2B:
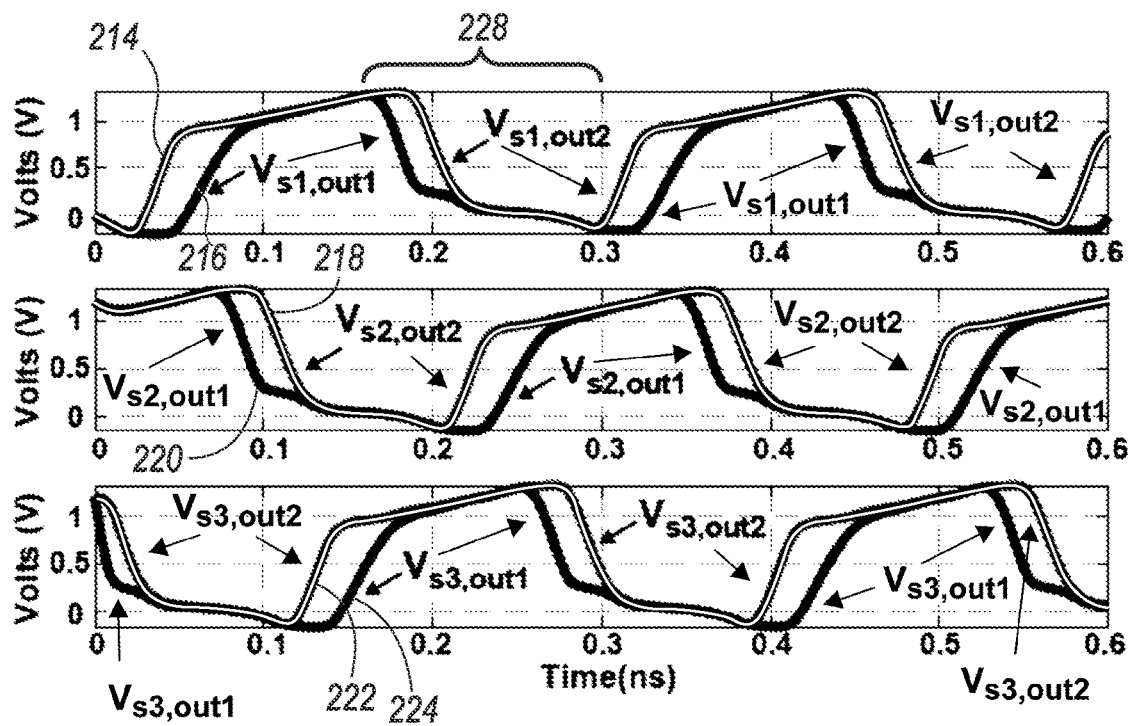
FIG. 2B illustrates an exemplary output of the exemplary structure of FIG. 2A.

Consider a simple three stage two level CMOS LIQAF Oscillator 200 expanded out for three stages to form a ring oscillator in FIG. 2A. In this implementation there are three exemplary horizontal LIQAF blocks, 202, 204, 206 which correspond to the number of stages, and there are two outputs for each stage, respectively, 208/209, 210/211, 212/213. Each of the outputs feeds into the next stage. The three LIQAF pairs 202, 204, 206 in FIG. 2A are $M_{s1,3}/M_{s1,2}$, $M_{s2,3}/M_{s2,2}$, and $M_{s3,3}/M_{s3,2}$. Each exemplary LIQAF block 202, 204, 206 has a pair of phase shifted waveforms, owing to the stacking effect discussed above. Each stage has another pair of outputs that are phase shifted from the previous stage due to the propagation delay of the LIQAF. The result is six distinct outputs 214, 216, 218, 220, 222, 224 because of the six intermediate outputs, 208/209, 210/211, 212/213 as illustrated in FIG. 2B.

The operation of this circuit of FIG. 2A is as follows—first the initial condition of the feedback loop is $V_{DD}$(HIGH STATE). Then, $V_{s1,out2}$ and $V_{s1,out1}$ will both react to this input by going low. From the previous discussion, it is known that $V_{s1,out1}$ goes LOW before $V_{s1,out2}$, so that is the order in which that event will take place. After that, with little overlap the next stage will react to $V_{s1,out2}$ and $V_{s1,out1}$ because that is now the input to the next stage. Since, $V_{s1,out2}$ and $V_{s1,out1}$ are both low, $V_{s2,out2}$ and $V_{s2,out1}$ will both go high. $V_{s2,out2}$ will go high before $V_{s2,out1}$. That will in turn drive feedback stage(s) 226 low and continue the oscillation. It is noted that each exemplary LIQAF stage 202, 204, 206 will react to its input before the next stage has a significant change. Assuming feedback is initialized to $V_{DD}$, the order of excitation is as follows (shown in the bracketed region 228): $V_{s1,out1}$, $V_{s1,out2}$, $V_{s2,out2}$, $V_{s2,out1}$, $V_{s3,out1}$, and $V_{s3,out2}$.

Figure 3:
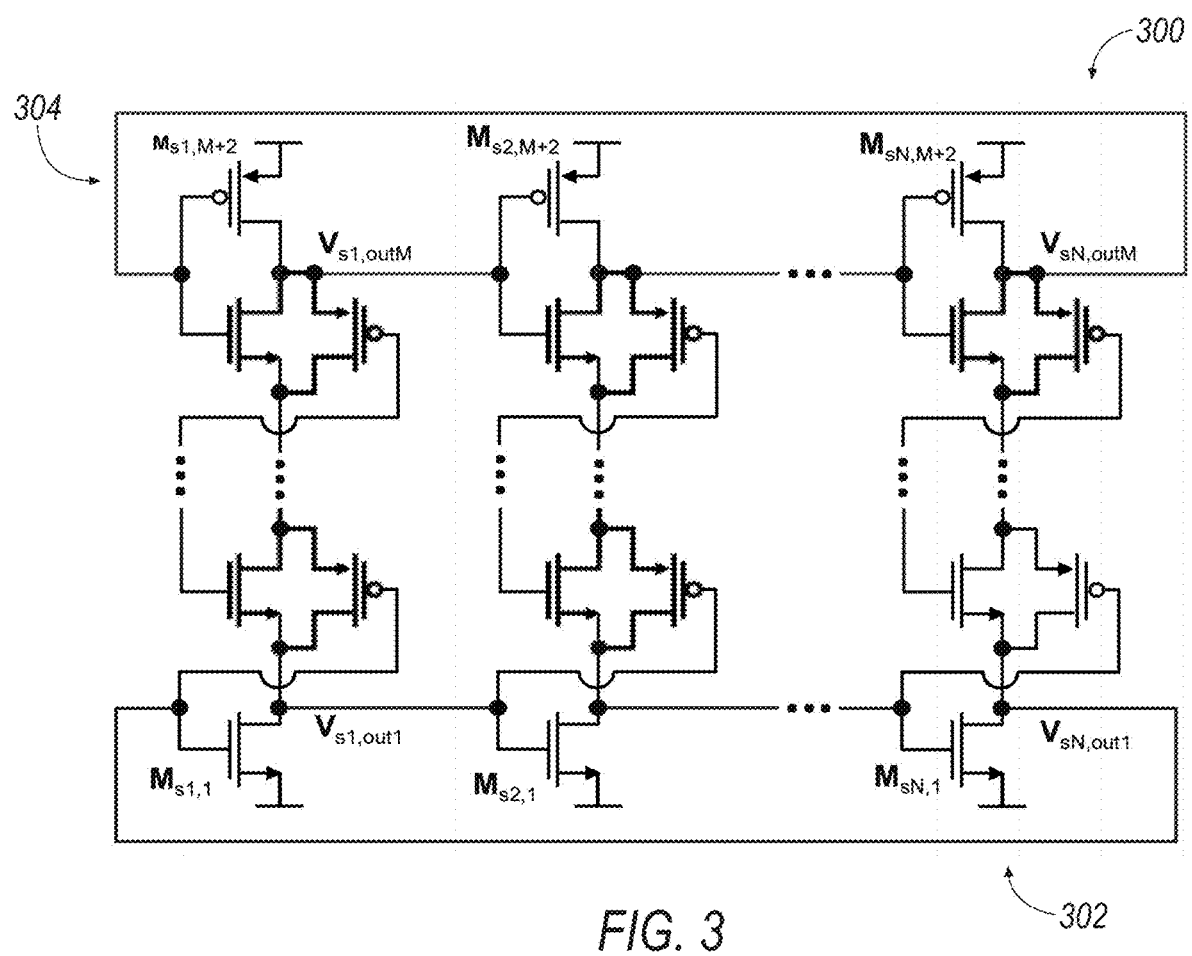
FIG. 3 is an illustration of an exemplary general CMOS LIQAF topology having an arbitrary number of outputs.

In more general terms, the exemplary CMOS LIQAF ring oscillator can be expanded out an arbitrary number of outputs. FIG. 3 illustrates an exemplary ring oscillator 300 with additional N series stages 302 and additional parallel LIQAF M stages 304. It is noted that the number of columns, N (302), in FIG. 3 are an odd number to maintain oscillation. In the CMOS inverter ring oscillator an odd number of phases are generated while the exemplary CMOS LIQAF ring oscillator can generate both an even and odd number of distinct phases.

Thus, the exemplary CMOS Laddered-Inverter Quantizer/Amplifier/Filter (LIQAF) ring oscillator can be increased by the number of stages and the number of outputs. Increasing the number of stages is a horizontal increase while increasing the number of outputs is a vertical increase. Up to 32 unique output waveforms are discussed herein, but this can be increased indefinitely vertically or horizontally (e.g., with an odd number of stages) for more phases if based on desired output frequency.

The exemplary ring oscillator can also be used as a digitally-controlled pulse-width modulation (PWM) generator if, for example, a multiplexer (MUX) is placed at the outputs. This mode of operation is suitable for usage in, for example, buck/boost converters. The duty cycle has a range of approximately 32% to 73% at approximately 1.2V.

Simulation Results

Figure 4:
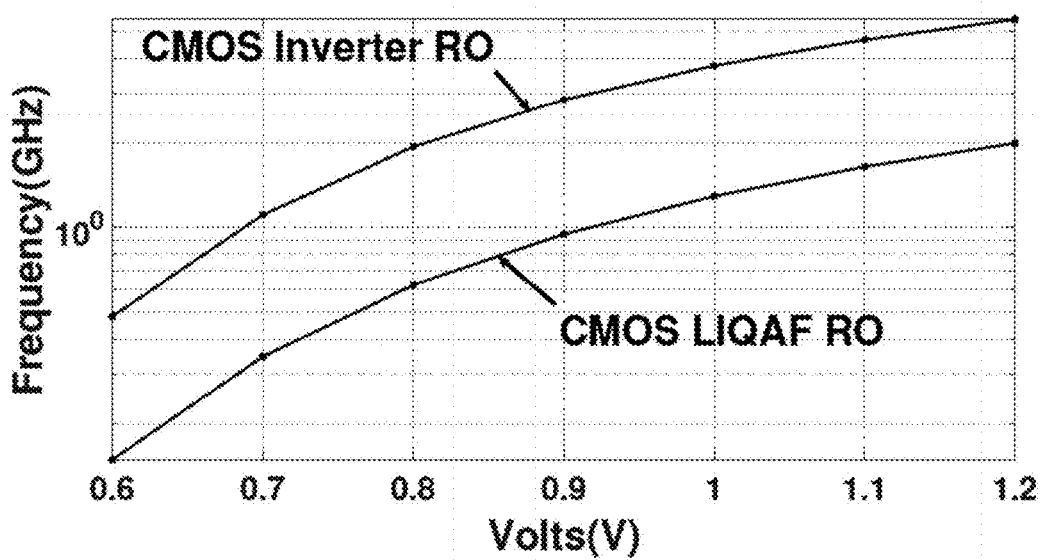
FIG. 4 illustrates an exemplary oscillation frequency comparison between an exemplary CMOS inverter ring oscillator and an exemplary CMOS LIQAF ring oscillator.
Figure 5:
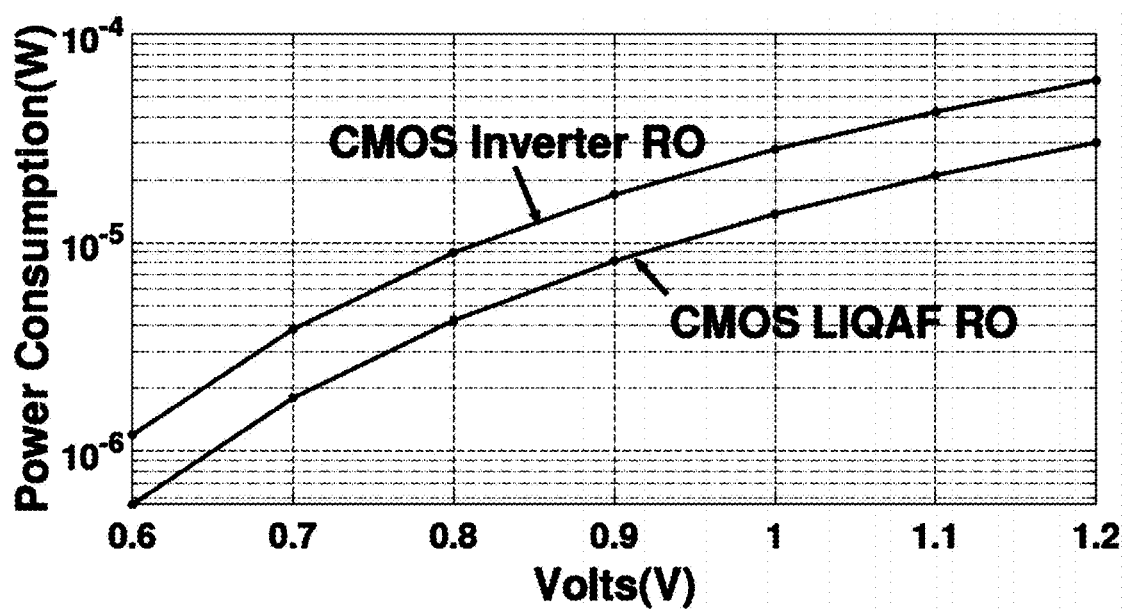
FIG. 5 illustrates an exemplary power consumption comparison between an exemplary CMOS inverter ring oscillator and an exemplary CMOS LIQAF ring oscillator.

A comparison was desired between the exemplary CMOS inverter ring oscillator and the exemplary CMOS LIQAF ring oscillator. It was concluded that this would be done on the basis of the number of phases. Generally, the lowest number of phases that could be achieved between the two architectures that would be equal is nine phases. The exemplary nine phase CMOS inverter ring oscillator was created with nine CMOS inverter in series and the ninth inverter's output connected to the first inverter's input. The exemplary nine phase CMOS LIQAF ring oscillator was created with three output levels and three stages. FIG. 4 illustrates an exemplary comparison of the oscillation frequency of the two topologies. Both topologies have a response that is almost linear with the exemplary LIQAF ring oscillator having a lower oscillation frequency due to the stacking effect. FIG. 5 illustrates an exemplary power consumption comparison between the two topologies. Both topologies have dynamic power consumption as a generally dominant factor in the overall power consumption. In the case of the exemplary LIQAF, it has a lower oscillation frequency, thus lower power consumption.

Figure 6:
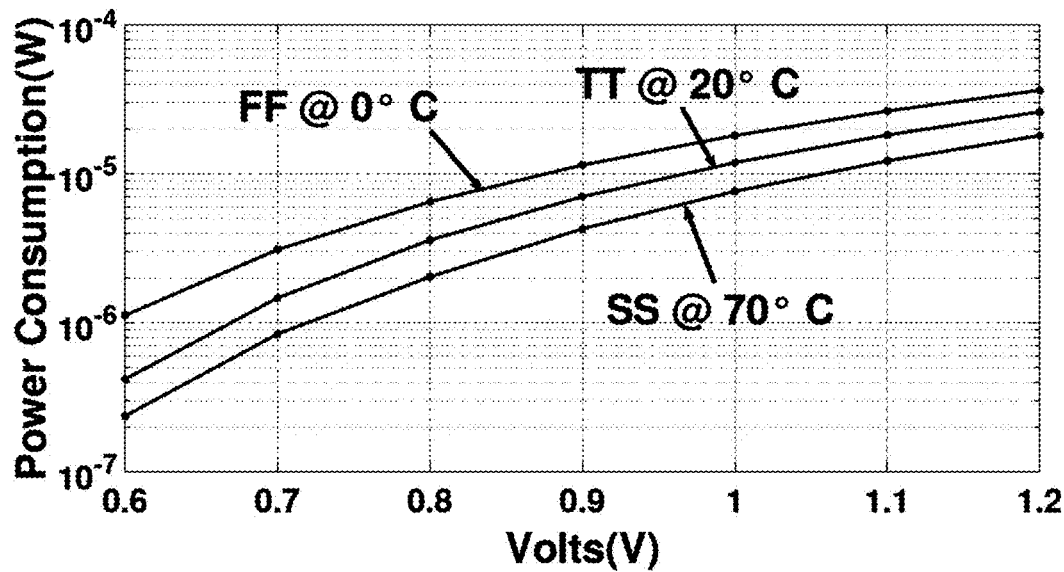
FIG. 6 illustrates an exemplary power consumption comparison robustness simulation.
Figure 7:
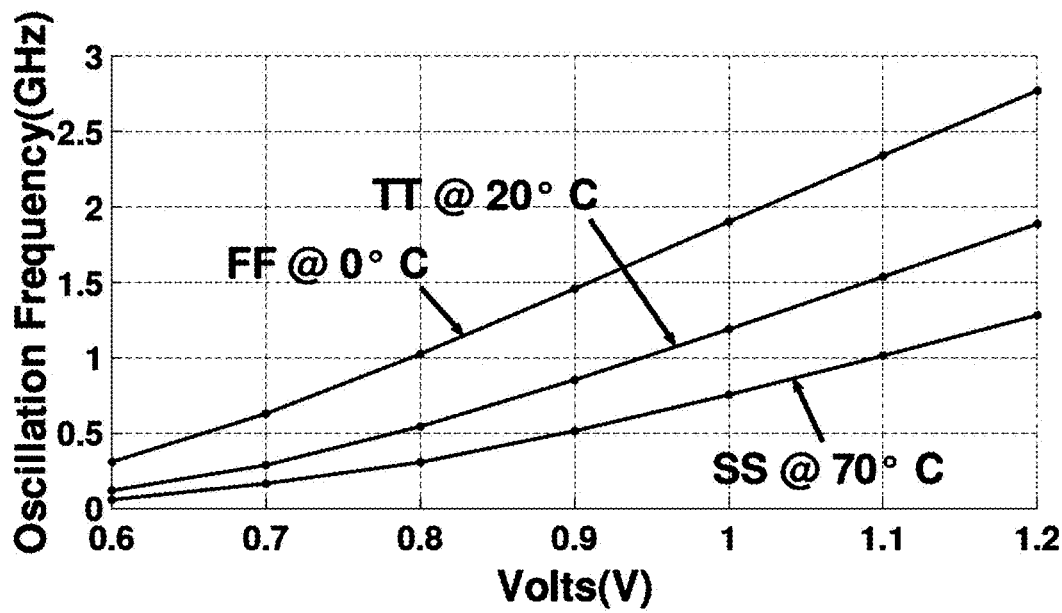
FIG. 7 illustrates an exemplary oscillation frequency robustness simulation.

FIG. 6 illustrates process, temperature, and exemplary voltage robustness performance of the power consumption. FIG. 7 illustrates the process, temperature, and exemplary voltage robustness performance of the oscillation frequency, noting that the oscillation frequency is highly linear under any variation. In the figures, FF refers to the fast/fast process corner, TT is typical/typical or nominal process corner, and SS means the slow/slow process corner.

Figure 8:
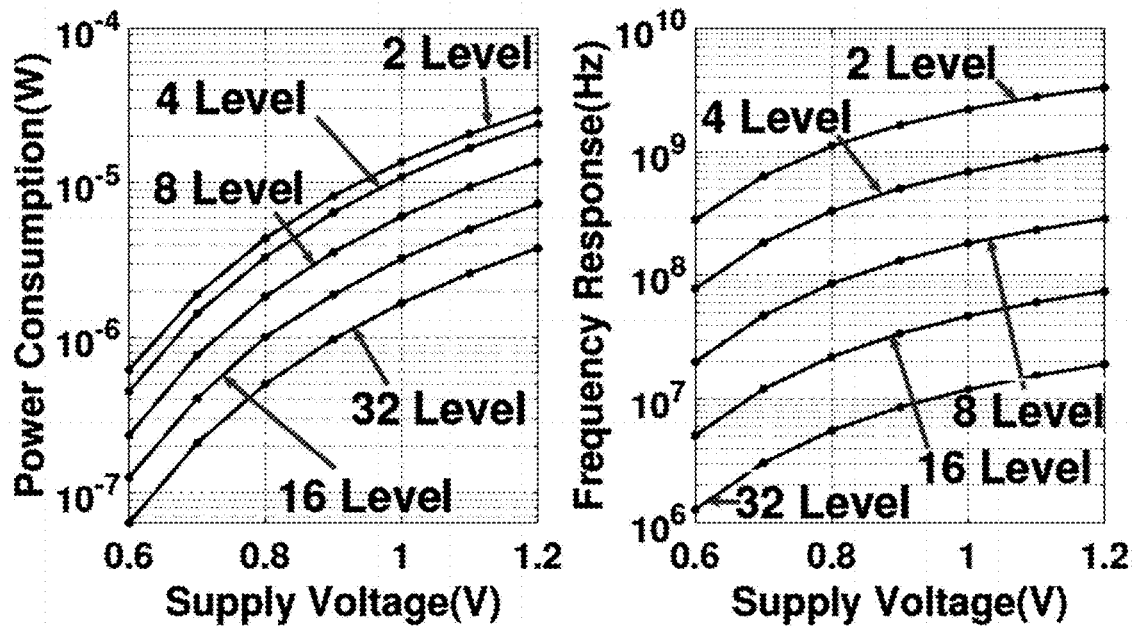
FIG. 8 illustrates exemplary multi-level CMOS LIQAF ring oscillator output plots for power consumption and oscillation frequency vs. supply voltage.

The exemplary CMOS LIQAF ring oscillator may be extended out in both dimensions—horizontal and vertical. As such, more levels can be created, resulting in more intermediate outputs and more stages. In the example, there are an odd number of stages. Illustrated in FIG. 8 is exemplary power consumption and oscillation frequency of the exemplary 2, 4, 8, 16, and 32 level outputs, with three stage CMOS LIQAF ring oscillators.

The exemplary CMOS LIQAF ring oscillator can also function as, for example, a PWM generator if, for example, a MUX is placed at the output. For the sake of simulation, two series CMOS inverters (output buffer) were placed in parallel with the feedback of each stage to obtain a clean output. These exemplary plots illustrate operation of a PWM generator. In at least one implementation, the output buffers would, for example, be replaced with a MUX that would allow the specific input to be chosen with a digital word at the SEL lines. The duty cycle has an approximate exemplary maximum range of 33% to 76% in the exemplary 32 level CMOS LIQAF ring oscillator. In each simulation, the duty cycle is generally linearly spread across the output duty cycle range.

Figure 9:
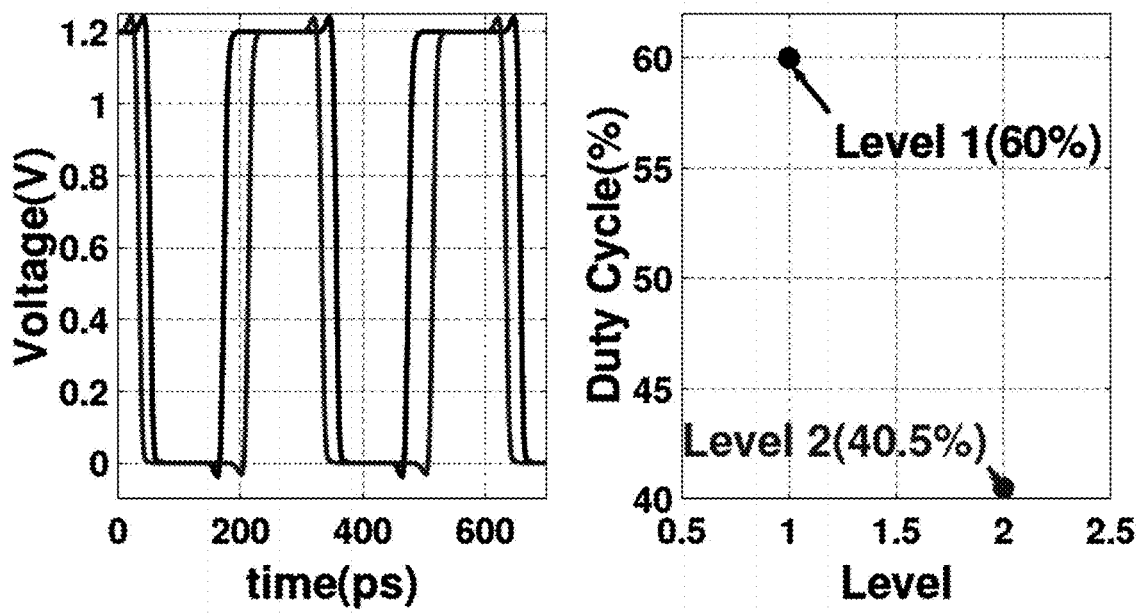
FIG. 9 illustrates an exemplary two (2) output pulse train having two (2) distinct outputs from a multiplexer (MUX) with each level having expanded duty cycle from the previous level.
Figure 10:
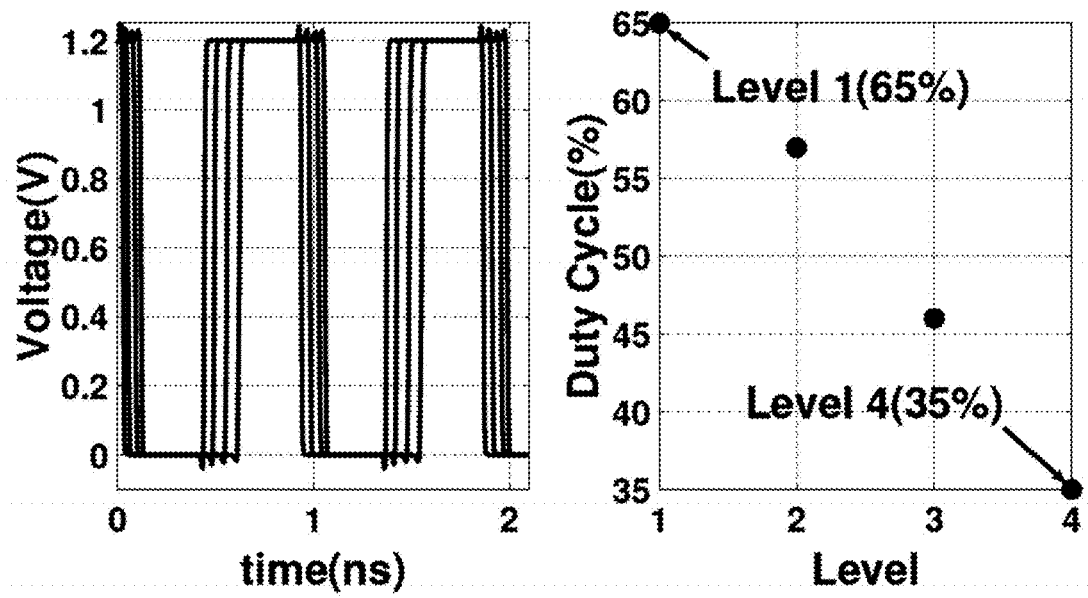
FIG. 10 illustrates an exemplary four (4) output pulse train having four (4) distinct outputs from a MUX with each level having expanded duty cycle from the previous level.
Figure 11:
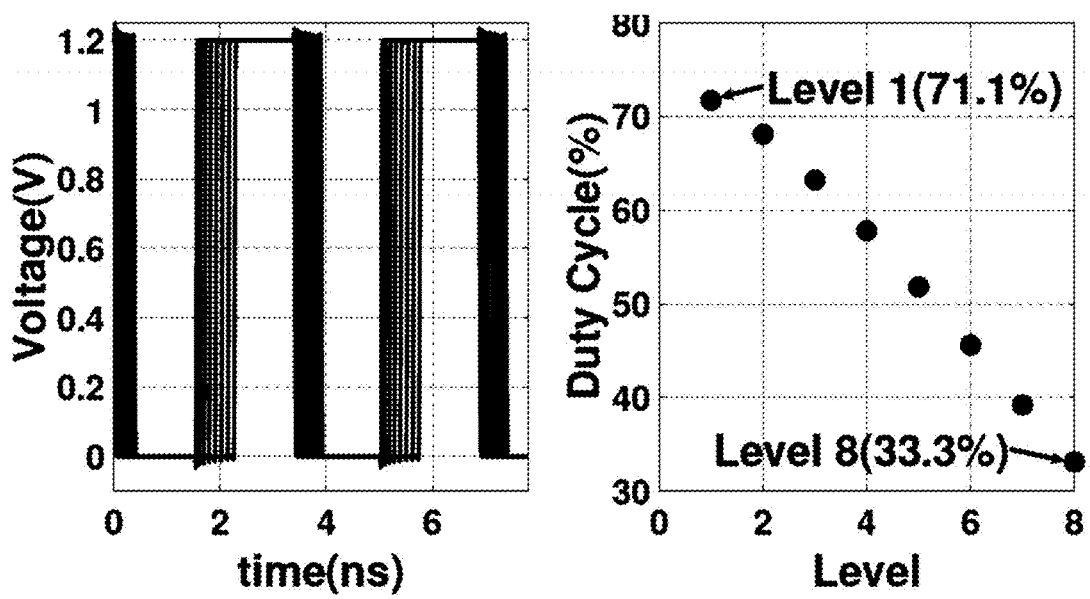
FIG. 11 illustrates an exemplary eight (8) output pulse train having eight (8) distinct outputs from a MUX with each level having expanded duty cycle from the previous level.
Figure 12:
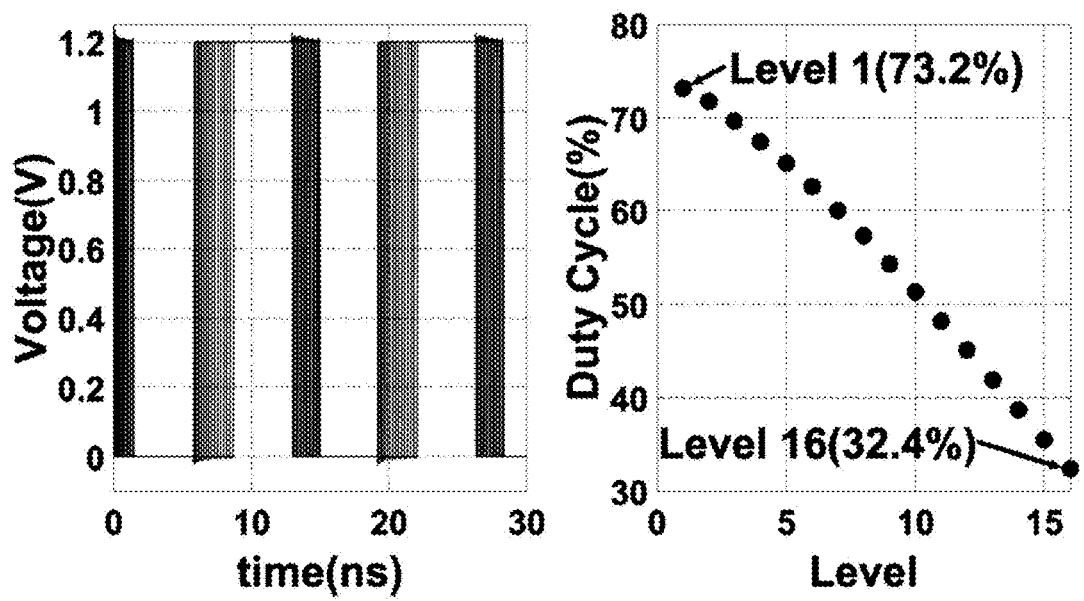
FIG. 12 illustrates an exemplary sixteen (16) output pulse train having sixteen (16) distinct outputs from a MUX with each level having expanded duty cycle from the previous level.
Figure 13:
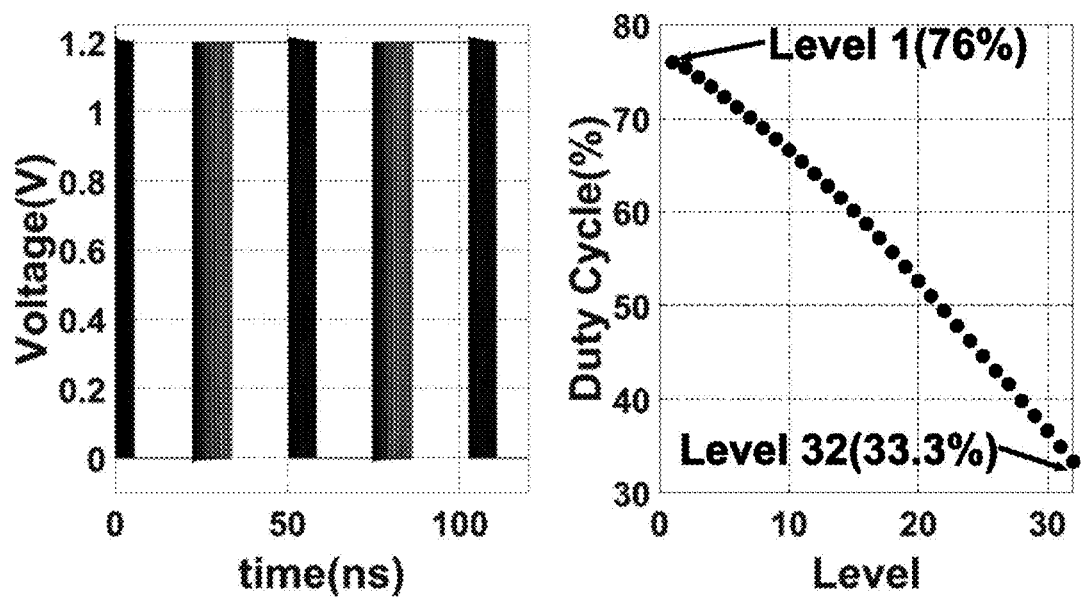
FIG. 13 illustrates an exemplary thirty-two (32) output pulse train having thirty-two (32) distinct outputs from a MUX with each level having expanded duty cycle from the previous level.

FIG. 9 illustrates an exemplary two (2) output pulse train having two (2) distinct outputs from a MUX with each level having expanded duty cycle from the previous level. FIG. 10 illustrates an exemplary four (4) output pulse train having four (4) distinct outputs from a MUX with each level having expanded duty cycle from the previous level. FIG. 11 illustrates an exemplary eight (8) output pulse train having eight (8) distinct outputs from a MUX with each level having expanded duty cycle from the previous level. FIG. 12 illustrates an exemplary sixteen (16) output pulse train having sixteen (16) distinct outputs from a MUX with each level having expanded duty cycle from the previous level. FIG. 13 illustrates an exemplary thirty-two (32) output pulse train having thirty-two (32) distinct outputs from a MUX with each level having expanded duty cycle from the previous level. FIGS. 9-13 illustrate how, for increasing numbers of levels the cycle time increases while the range of the duty cycle correspondingly increases which increases the resolution. For Example, FIG. 9 has two points between 60% and 40.5% while FIG. 11 has 8 points between 71.1% and 33.3%. Applications that benefit from this increased range and resolution include Pulse Width Modulation (PWM) inside DC-DC converters.

Figure 14:
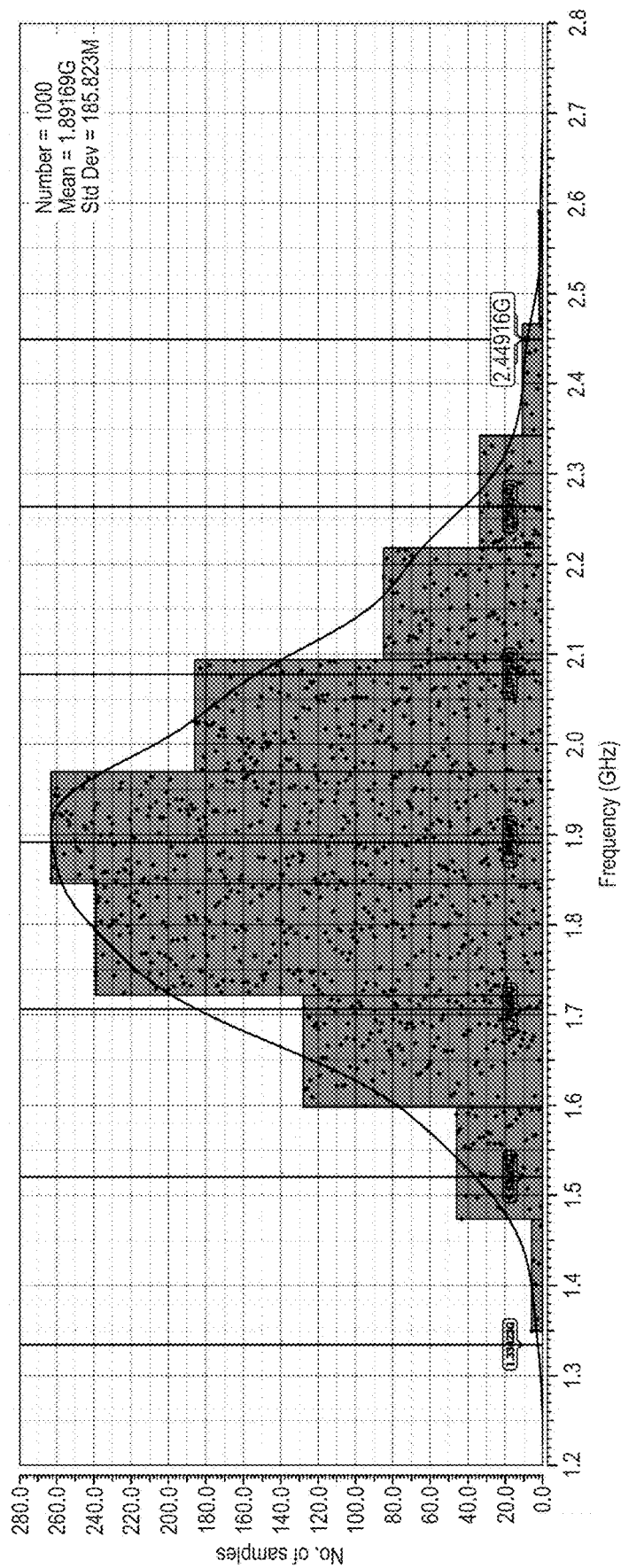
FIG. 14 illustrates an exemplary Monte Carlo analysis performed on an exemplary circuit with the variable being the output frequency. The exemplary Monte Carlo results agree with measured simulation results of 1.88 GHz at 1.2V, TT.

FIG. 14 illustrates an exemplary Monte Carlo analysis performed on an exemplary circuit with the variable being the output frequency. The exemplary Monte Carlo results agree with measured simulation results of 1.88 GHz at 1.2V, TT.

At least an exemplary low-power, multi-phase ring oscillator circuit simulated in a 65 nm CMOS process has been presented herein. Compared to a CMOS inverter ring oscillator, the above-described exemplary CMOS LIQAF ring oscillator generally can generate more output phases at a lower power, and at the cost of lower oscillation frequency. Accordingly, the above-described exemplary CMOS LIQAF ring oscillator can be implemented on, for example, IoT edge devices, low power-low speed devices, and battery saving circuits to name just a few applications. The disclosed exemplary CMOS LIQAF ring oscillator circuit has robust performance across temperature and process variations. Furthermore, the disclosed exemplary CMOS LIQAF ring oscillator circuit has the possibility to be implemented in Time-to-Digital Converters, among many other applications.

At least one disclosed circuit is a voltage-controlled ring oscillator that provides several phase-shifted outputs based on the laddered inverter circuit. The disclosed circuit generally achieves the several phase-shifted waveforms by using a chain of laddered inverters. These inverters each have their propagation delay, which give a phase-shifted version of the same waveform. The circuit may also generate a PWM (pulse width modulation) output using a MUX. The circuit can be increased to have an arbitrary number of output waveforms. The power consumption can be in the nano-watt range, which allows this to be used in wearable devices, portable devices, and edge IoT devices. Further, other exemplary circuit implementations include clock generators, low power PWM generators, low power and high resolution time-to-digital converters, low power digital-to-time converters, and DC-DC converters to name a few.

According to the disclosure, a ring oscillator includes a first set of at least three laddered inverter quantizer (LIQAF) circuits connected in stages that are in series, including a first LIQAF circuit and a last LIQAF circuit, and a feedback circuit from the last LIQAF circuit to the first LIQAF circuit having a logical NOT output compared to the first LIQAF circuit. A voltage input creates a pair of phase shifted waveforms in the first of the at least three LIQAF circuits that propagate sequentially through the stages of the at least three LIQAF circuits. Each stage has a pair of outputs to the next stage that are then phase shifted from the previous stage in the next stage.

Also according to the disclosure, a method of constructing a ring oscillator includes connecting a first set of at least three laddered inverter quantizer (LIQAF) circuits in stages that are in series, including a first LIQAF circuit and a last LIQAF circuit, and providing a feedback circuit from the last LIQAF circuit to the first LIQAF circuit having a logical NOT output compared to the first LIQAF circuit. A voltage input creates a pair of phase shifted waveforms in the first of the at least three LIQAF circuits that propagate sequentially through the stages of the at least three LIQAF circuits. Each stage has a pair of outputs to the next stage that are then phase shifted from the previous stage in the next stage.

A ring oscillator includes a structure having a two level CMOS laddered inverter quantizer (LIQAF) and three horizontal LIQAF blocks, the three horizontal LIQAF blocks in each of the two levels connected in stages that are in series, including a first LIQAF circuit and a last LIQAF circuit, and a feedback circuit from the last LIQAF circuit to the first LIQAF circuit having a logical NOT output compared to the first LIQAF circuit. A voltage input in the three horizontal LIQAF blocks in each of the two levels creates a pair of phase shifted waveforms in the first of the three horizontal LIQAF blocks that propagate sequentially through the stages of the three LIQAF blocks. Each stage of the three horizontal LIQAF blocks in each of the two levels has a pair of outputs to the next stage that are then phase shifted from the previous stage in the next stage.

With regard to the figures, processes, systems, methods, techniques, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description or Abstract below, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

When introducing elements of various embodiments of the disclosed materials, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

While the preceding discussion is generally provided in the context of medical imaging, it should be appreciated that the present techniques are not limited to such medical contexts. The provision of examples and explanations in such a medical context is to facilitate explanation by providing instances of implementations and applications. The disclosed approaches may also be utilized in other contexts, such as the non-destructive inspection of manufactured parts or goods (i.e., quality control or quality review applications), and/or the non-invasive inspection or imaging techniques.

While the disclosed materials have been described in detail in connection with only a limited number of embodiments, it should be readily understood that the embodiments are not limited to such disclosed embodiments. Rather, that disclosed can be modified to incorporate any number of variations, alterations, substitutions or equivalent arrangements not heretofore described, but which are commensurate with the spirit and scope of the disclosed materials. Additionally, while various embodiments have been described, it is to be understood that disclosed aspects may include only some of the described embodiments. Accordingly, that disclosed is not to be seen as limited by the foregoing description but is only limited by the scope of the appended claims.

What is claimed is:

1. A ring oscillator, comprising:
   a first set of at least three laddered inverter quantizer (LIQAF) circuits connected in stages that are in series, including a first LIQAF circuit and a last LIQAF circuit; and
   a feedback circuit from the last LIQAF circuit to the first LIQAF circuit, the last LIQAF circuit having a logical NOT output compared to a logical input of the first LIQAF circuit;
   wherein a voltage input creates a pair of phase shifted waveforms in the first of the at least three LIQAF circuits that propagate sequentially through the stages of the at least three LIQAF circuits; and
   wherein each stage has a pair of outputs to the next stage that are then phase shifted from the previous stage in the next stage.

2. The ring oscillator of claim 1, wherein each LIQAF circuit of the at least three LIQAF circuits includes a first inverter coupled to a second inverter.

3. The ring oscillator of claim 2, wherein the first inverter includes a first pair of semiconductors and the second inverter includes a second pair of semiconductors.

4. The ring oscillator of claim 3, wherein the first pair of semiconductors are each n-channel metal oxide (NMOS)

semiconductors, and the second pair of semiconductors are each p-channel metal oxide (PMOS) semiconductors.

5. The ring oscillator of claim 1, wherein one of the pairs of outputs to the next stage produces the pair of phase shifted waveforms in the next stage are HI if the pairs of outputs is LOW, and LOW if the pairs of outputs is HI.

6. The ring oscillator of claim 1, wherein the at least three LIQAF circuits include an odd number of LIQAF circuits.

7. The ring oscillator of claim 1, further comprising a second set of LIQAF circuits that are connected vertically and in parallel with the first set of at least three LIQAF circuits, the second set itself including the same number of horizontal LIQAF circuits as the first set.

8. A method of constructing a ring oscillator, comprising:
connecting a first set of at least three laddered inverter quantizer (LIQAF) circuits in stages that are in series, including a first LIQAF circuit and a last LIQAF circuit; and
providing a feedback circuit from the last LIQAF circuit to the first LIQAF circuit, the last LIQAF circuit having a logical NOT output compared to a logical input of the first LIQAF circuit;
wherein a voltage input creates a pair of phase shifted waveforms in the first of the at least three LIQAF circuits that propagate sequentially through the stages of the at least three LIQAF circuits; and
wherein each stage has a pair of outputs to the next stage that are then phase shifted from the previous stage in the next stage.

9. The method of claim 8, wherein connecting the first set further includes coupling a first inverter to a second inverter in each LIQAF circuit of the at least three LIQAF circuits.

10. The method of claim 9, wherein the first inverter includes a first pair of semiconductors and the second inverter includes a second pair of semiconductors.

11. The method of claim 10, wherein the first pair of semiconductors are each n-channel metal oxide (NMOS) semiconductors, and the second pair of semiconductors are each p-channel metal oxide (PMOS) semiconductors.

12. The method of claim 8, wherein one of the pairs of outputs to the next stage produces the pair of phase shifted waveforms in the next stage are HI if the pairs of outputs is LOW, and LOW if the pairs of outputs is HI.

13. The method of claim 8, wherein connecting the at least three LIQAF circuits includes connecting an odd number of LIQAF circuits.

14. The method of claim 8, further comprising connecting a second set of LIQAF circuits vertically and in parallel with the first set of at least three LIQAF circuits, the second set itself including the same number of horizontal LIQAF circuits as the first set.

15. A ring oscillator, comprising:
a structure having a two level CMOS laddered inverter quantizer (LIQAF) and three horizontal LIQAF blocks;
the three horizontal LIQAF blocks in each of the two levels connected in stages that are in series, including a first LIQAF circuit and a last LIQAF circuit, and a feedback circuit from the last LIQAF circuit to the first LIQAF circuit, the last LIQAF circuit having a logical NOT output compared to a logical input of the first LIQAF circuit;
wherein the voltage input in the three horizontal LIQAF blocks in each of the two levels creates a pair of phase shifted waveforms in the first of the three horizontal LIQAF blocks that propagate sequentially through the stages of the three LIQAF blocks; and
wherein each stage of the three horizontal LIQAF blocks in each of the two levels has a pair of outputs to the next stage that are then phase shifted from the previous stage in the next stage.

16. The ring oscillator of claim 15, wherein each LIQAF circuit of the three LIQAF circuits in each of the two levels includes a first inverter coupled to a second inverter.

17. The ring oscillator of claim 16, wherein the first inverter in each of the two levels includes a first pair of semiconductors and the second inverter in each of the two levels includes a second pair of semiconductors.

18. The ring oscillator of claim 17, wherein the first pair of semiconductors in each of the two levels are each n-channel metal oxide (NMOS) semiconductors, and the second pair of semiconductors in each of the two levels are each p-channel metal oxide (PMOS) semiconductors.

19. The ring oscillator of claim 15, wherein one of the pairs of outputs to the next stage in each of the two levels produces the pair of phase shifted waveforms in the next stage in each of the two levels are HI if the pairs of outputs is LOW, and LOW if the pairs of outputs is HI.

20. The ring oscillator of claim 15, wherein the three LIQAF circuits in each of the two levels include an odd number of LIQAF circuits.

* * * * *